(12) United States Patent
Kye et al.

(10) Patent No.: US 8,581,337 B2
(45) Date of Patent: Nov. 12, 2013

(54) SEMICONDUCTOR DEVICE FOR INCREASING BIT LINE CONTACT AREA, AND MODULE AND SYSTEM INCLUDING THE SAME

(75) Inventors: Jung Seob Kye, Icheon-si (KR); Jung Min Han, Seongnam-si (KR)

(73) Assignee: Hynix Semiconductor Inc., Icheon (KR)

( * ) Notice: Subject to any disclaimer, the term of this patent is extended or adjusted under 35 U.S.C. 154(b) by 11 days.

(21) Appl. No.: 13/347,614

(22) Filed: Jan. 10, 2012

(65) Prior Publication Data

US 2013/0119462 A1    May 16, 2013

(30) Foreign Application Priority Data

Nov. 15, 2011   (KR) .......................... 10-2011-0119001

(51) Int. Cl.
*H01L 29/78*    (2006.01)

(52) U.S. Cl.
USPC ............ 257/331; 257/E29.262; 257/E21.159; 438/586

(58) Field of Classification Search
USPC .................. 257/296, 330, E21.658, E21.649, 257/E27.103
See application file for complete search history.

(56) References Cited

U.S. PATENT DOCUMENTS

2011/0147834 A1\*   6/2011   Taniguchi ..................... 257/330

\* cited by examiner

*Primary Examiner* — Zandra Smith
*Assistant Examiner* — Paul Patton

(57) ABSTRACT

A semiconductor device including a buried gate is disclosed. In the semiconductor device, a bit line contact contacts a top surface and lateral surfaces of an active region, such that a contact area between a bit line contact and the active region is increased and a high-resistivity failure is prevented from occurring in a bit line contact.

10 Claims, 11 Drawing Sheets

US 8,581,337 B2

SEMICONDUCTOR DEVICE FOR INCREASING BIT LINE CONTACT AREA, AND MODULE AND SYSTEM INCLUDING THE SAME

CROSS-REFERENCE TO RELATED APPLICATION

The priority of Korean patent application No. 10-2011-00119001 filed on 15 Nov. 2011, the disclosure of which is hereby incorporated in its entirety by reference, is claimed.

BACKGROUND OF THE INVENTION

Embodiments of the present invention relate to a semiconductor device including a buried gate, and more particularly to a semiconductor device increasing a contact area between a bit line contact and an active region to improve external resistance of the bit line contact.

Semiconductor devices are designed to be used for particular purposes by implanting impurities, and/or depositing a new material at a predetermined region of a silicon wafer. A semiconductor memory device may include a large number of elements to carry out given purposes, for example, transistors, capacitors, resistors, and the like. Individual elements are interconnected through a conductive layer so that data or signals are communicated therebetween.

With the increasing development in technologies for manufacturing semiconductor devices, research has been conducted into a method for forming more chips on one wafer by increasing the integration degree of semiconductor devices. To increase the integration degree of such semiconductor devices, a minimum feature size required for the design rules of semiconductor devices becomes smaller.

An active region of the semiconductor device having a $6F^2$-sized unit cell (where, F is a minimum feature size) may be configured in an elliptical shape, with a long axis of the active region tilted by a predetermined angle with respect to the progressing direction of bit lines in such a manner that the active region includes a buried gate structure in which a word line is buried in a semiconductor substrate.

In the $6F^2$-sized semiconductor device, a bit line contact may be coupled to an active region between buried gates, and bit lines may be formed to be connected to the top part of the bit line contact.

However, as the unit cell is reduced in size due to higher integration of the semiconductor device, the bit line contact is also reduced in size, possibly resulting in the occurrence of high resistivity. As a result, may be difficult to normally write and read data in and from a cell.

Therefore, there is needed a method for solving the high-resistivity problem caused by reduction in the bit line contact size.

BRIEF SUMMARY OF THE INVENTION

Various embodiments of the present invention are directed to providing a semiconductor device increasing a bit line contact area and a module and apparatus including the same, that substantially obviate one or more problems due to limitations and disadvantages of the related art.

An embodiment of the present invention relates to a semiconductor device including a buried gate, which increases a bit line contact area by improving a bit line contact structure.

In accordance with an aspect of the present invention, a semiconductor device includes a first gate buried in a lower part of a first trench defined in an active region, a first sealing layer provided at an upper part of the first trench and over the first gate, a second gate buried in a lower part of a second trench defined in the active region, a second sealing layer provided at an upper part of the second trench and over the second gate and a contact plug associated with the first gate, the contact plug extending between the first and second trenches to contact a top surface, the contact plug extending partly into the first and second trenches.

The contact plug contacts a lateral surface of the active region between the first and second trenches.

The contact plug may be formed to enclose an upper part of the active region between the first trench and the second trench.

The contact plug may contact a lateral surface of the active region between the first and second trenches, wherein the lateral surface may include inner lateral surface of the first trench and the second trench. The lateral surface may correspond to an area which overlaps a bit line from among the inner lateral surfaces of the first and second trenches.

In accordance with another aspect of the present invention, a semiconductor device includes an active region provie on a substrate, a first trench defined in the active region, a first gate buried in a lower part of the first trench, a first sealing layer provided at an upper part of the first trench and a contact plug extending into the first trench, the contact plug contacting a top surface and a first lateral surface of the active region. The lateral surface may be an inner lateral surface of the trench.

The semiconductor device further includes a second trench defined in the active region, a second gate buried in a lower part of the second trench and a second sealing layer provided at an upper part of the second trench, wherein the contact plug extends into the second trench and contacts a second lateral surface of the active region.

In accordance with another aspect of the present invention, a method for forming a semiconductor device includes forming a device isolation film defining an active region; forming a first buried gate and a second buried gate over the active region; forming a contact hole to protrude the active region located between the first buried gate and the second buried gate; forming a contact layer to bury the contact hole; forming a conductive film over the contact layer; and forming a bit line and a bit line contact by etching the conductive film and the contact layer.

The forming the first buried gate and the second buried gate may include forming a first trench and a second trench by etching the active region; forming a gate conductive film at lower parts of the first and second trenches; and forming a sealing layer over the gate conductive film so as to bury the first trench and the second trench.

The forming the contact hole may include forming an interlayer insulation film over the active region including the gate conductive film and the sealing layer; and etching the interlayer insulation film, the device isolation film, and the sealing layer using a bit line contact mask, thereby exposing top and lateral surfaces of the active region between the first buried gate and the second buried gate.

The forming the bit line and the bit line contact may include sequentially etching the conductive film and the contact layer using a bit line mask.

The forming the bit line contact may include etching the contact layer in a manner that the contact layer is formed to contact not only a top surface of the active region but also inner lateral surfaces of the first and second trenches.

In accordance with another aspect of the present invention, a semiconductor device includes a cell array which includes first and second word lines buried in an active region, a bit line coupled to the active region between the first and second word lines through a contact, and a memory cell coupled to the word lines and the bit line; and a sense amplifier coupled to the bit line so as to sense data stored in the memory cell, wherein the contact is formed to contact top and lateral surfaces of the active region between the first word line and the second word line.

The semiconductor device may further include a row decoder configured to output a selection signal which selects a cell in which data is to be read or written from among the cell array; and a column decoder configured to output a drive signal for operating a sense amplifier coupled to a cell selected by the selection signal.

In accordance with another aspect of the present invention, a semiconductor module including a plurality of semiconductor devices mounted to a substrate includes the semiconductor device including a first gate buried in a lower part of a first trench included in an active region; a second gate buried in a lower part of a second trench included in the active region; and a contact shared in the first gate and the second gate, and formed to contact top and lateral surfaces of the active region between the first gate and the second gate.

In accordance with another aspect of the present invention, a semiconductor system includes a semiconductor module including a plurality of semiconductor devices mounted to a substrate and a controller for controlling operations of the semiconductor module. The semiconductor device includes a first gate buried in a lower part of a first trench included in an active region; a second gate buried in a lower part of a second trench included in the active region; and a contact shared in the first gate and the second gate, and formed to contact top and lateral surfaces of the active region between the first gate and the second gate.

In accordance with another aspect of the present invention, a computer system includes a semiconductor system including at least one semiconductor module and a processor for processing data stored in the semiconductor system. The semiconductor device includes a plurality of semiconductor devices mounted to a substrate. The semiconductor device includes a first gate buried in a lower part of a first trench included in an active region; a second gate buried in a lower part of a second trench included in the active region; and a contact shared in the first gate and the second gate, and formed to contact top and lateral surfaces of the active region between the first gate and the second gate.

In accordance with another aspect of the present invention, a data processing system including at least one semiconductor device mounted to a substrate includes the semiconductor device. The semiconductor device includes a first gate buried in a lower part of a first trench included in an active region; a second gate buried in a lower part of a second trench included in the active region; and a contact shared in the first gate and the second gate, and formed to contact top and lateral surfaces of the active region between the first gate and the second gate.

In accordance with another aspect of the present invention, an electronic system including at least one data processing system includes the data processing system including at least one semiconductor device mounted to a substrate. The semiconductor device includes a first gate buried in a lower part of a first trench included in an active region; a second gate buried in a lower part of a second trench included in the active region; and a contact shared in the first gate and the second gate, and formed to contact top and lateral surfaces of the active region between the first gate and the second gate.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
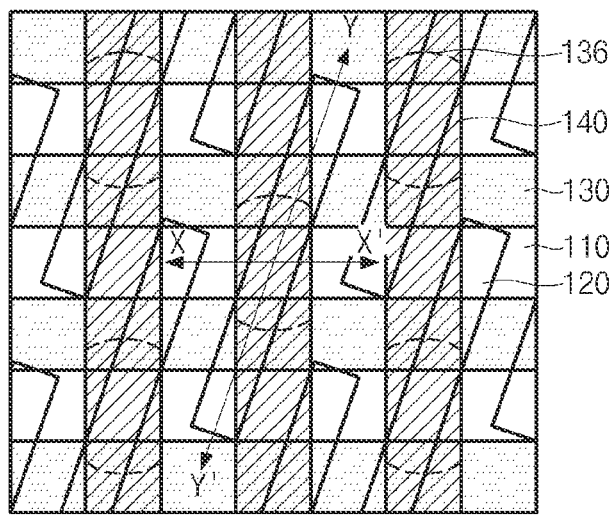
FIG. 1 is a plan view illustrating a cell array structure of a semiconductor device according to one embodiment of the present invention.
Figure 2:
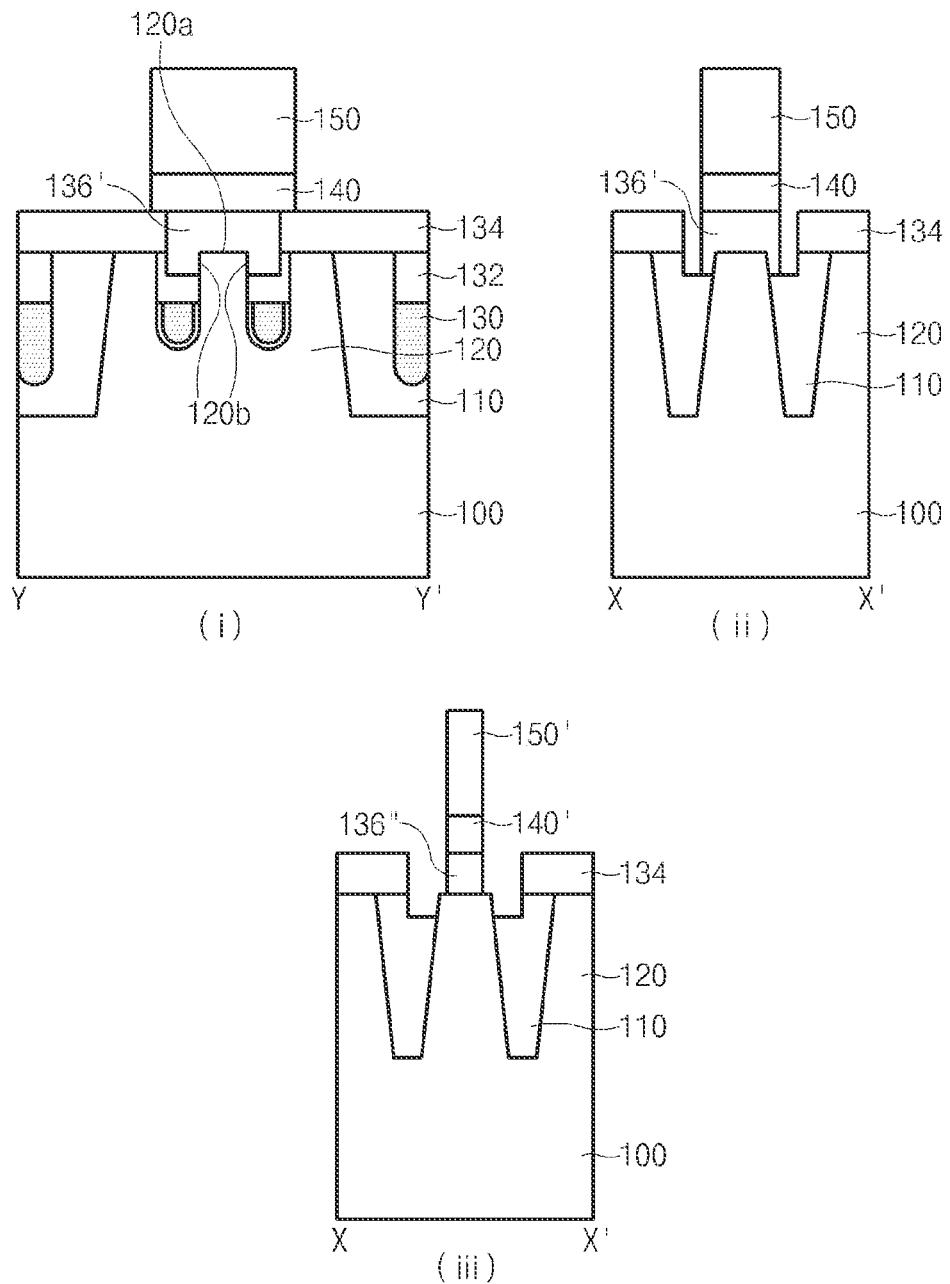
FIG. 2 is a cross-sectional view taken along the line Y-Y' (i), or the line X-X' (ii) and (iii), of FIG. 1, illustrating an embodiment of a semiconductor device.

FIG. 1 is a plan view illustrating a cell array structure of a semiconductor device according to one embodiment of the present invention. FIG. 2 is a cross-sectional view illustrating a semiconductor device taken along the line Y-Y' or the line X-X' of FIG. 1. FIG. 2(i) is a cross-sectional view illustrating the semiconductor device taken along the line Y-Y' of FIG. 1, and FIG. 2(ii) is a cross-sectional view illustrating the semiconductor device taken along the line X-X' of FIG. 1.

An active region 120 defined by a device isolation film 110 is formed over a semiconductor substrate 100. Each active region 120 is formed to cross two gates 130, and is divided into three regions by the two gates 130. That is, the active region 120 is divided into a bit line contact region between two gates 130 and a storage node contact region located outside of the two gates 130. In this embodiment, the gate 130 is buried in the active region 120 and the device isolation film 110 in such a manner that it is configured in the form of a buried gate. A sealing layer (or capping layer) 132 is formed over the buried gate 130. A junction region is formed over the active regions 120 of the bit line contact region and the storage node contact region.

A bit line contact 136' (or a bit line contact plug or contact plug) is formed over the active region of the bit line contact region, and a bit line is formed over the bit line contact 136' so as to cross the buried gate 130. The bit line 140 is configured in the form of a line having a predetermined width, and is arranged to be tilted by between about 15°-20° in the diagonal direction with respect to the long axis of the active region 120. That is, the embodiment of FIG. 1 shows a $6F^2$-sized layout.

Especially, the bit line contact 136' according to an embodiment of the present embodiment is formed to enclose an upper part of the active region as shown in FIG. 2. That is, the bit line contact 136' is formed to enclose the upper part of the active region in such a manner that it is brought into contact with the top surface 120a of the active region 120 and the lateral surface 120b of the active region 120. As used herein in, the term lateral surface refers to a surface that is in a different plane than the top surface 120a, e.g., a sidewall or sidewalls defined by two trenches that define the top surface 120a.

In this embodiment, the bit line contact 136 is formed only in the area overlapping the bit line 140, such that it can sufficiently guarantee spacing between the bit line contact 136 and the storage node contact (not shown) formed over another neighbor active region. That is, the contact region between the bit line contact 136 and the active region 120 is maximized in size and the bit line contact 136 is formed not to escape from a region in which the bit line 140 is formed, such that interference with the storage node contact (not shown) formed over a neighbor active region can be minimized.

The hard mask layer 150 is formed over the bit line 140. As can be seen from FIG. 2(iii), assuming that a hard mask pattern 150' is formed to have a smaller width, the bit line contact 136" does not contact with the lateral surface of the active region 120 in the direction of X-X', whereas it does contact the lateral surface of the active region 120 in the direction of Y-Y'. In this embodiment, although the contact area between the bit line contact 136" and the active region 120 is somewhat smaller, interference with the storage node contact (not shown) formed over the neighbor active region can be greatly reduced.

FIGS. 3A to 3D are cross-sectional views illustrating a method for fabricating the embodiment of the semiconductor device shown in FIGS. 1 and 2. In each of FIGS. 3A to 3D, (i) is a cross-sectional view illustrating the semiconductor device taken along the line Y-Y' of FIG. 1, and (ii) is a cross-sectional view illustrating the semiconductor device taken along the line X-X' of FIG. 1.

Figure 3A:
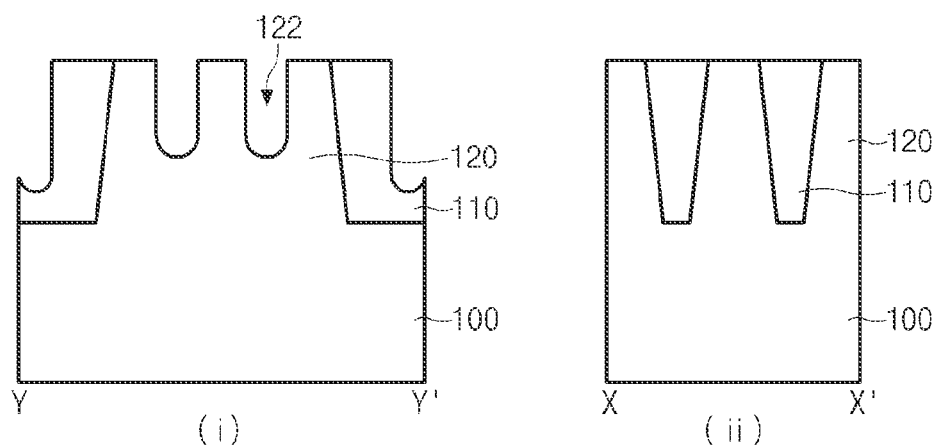
FIGS. 3A to 3D are cross-sectional views illustrating a method for fabricating the embodiment of the semiconductor device shown in FIG. 2.

Referring to FIG. 3A, a shallow trench isolation (STI) process is performed so that the device isolation film 110 defining the active region 120 is formed over the semiconductor substrate 100.

For example, after a pad nitride film (not shown) is formed over the semiconductor substrate 100, a photoresist pattern (not shown) defining a device isolation region is formed over the pad nitride film. Subsequently, the pad nitride film and the semiconductor substrate 100 are etched using the photoresist pattern as an etch mask, such that a device isolation trench (not shown) is formed. In this embodiment, in order to facilitate trench formation, a pad oxide film may be additionally formed between the semiconductor substrate 100 and the pad nitride film. A wall oxidation layer acting as an oxide film and a liner nitride film are formed at inner lateral surfaces of the device isolation trench.

Subsequently, an insulation film (not shown) is formed to bury the device isolation trench. The insulation film may be formed of any one of a Spin On Dielectric (SOD), a High Density Plasma (HDP), and a combination thereof. Subsequently, the insulation film is planarized by Chemical Mechanical Polishing (CMP), so that the device isolation film 110 is formed.

After that, the device isolation film 100 and the active region 120 are etched using a mask defining a gate region. This forms a recess 122 having a predetermined depth.

Figure 3B:
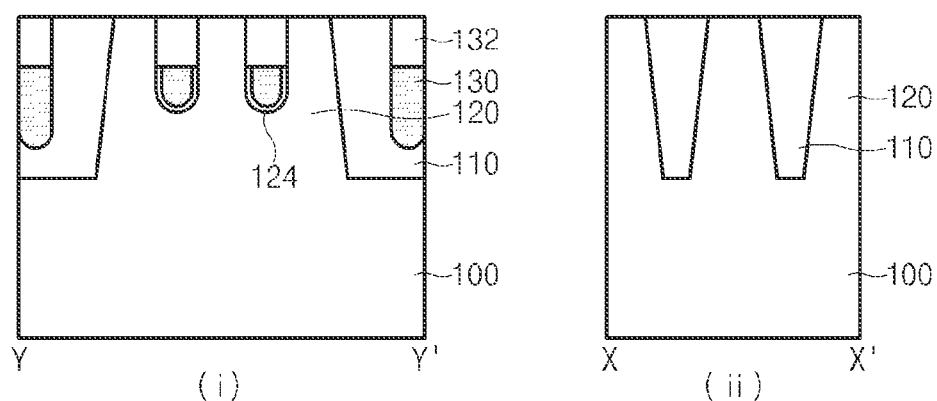

Referring to FIG. 3B, after a gate insulation film 124 is formed at inner lateral surfaces of the recess 122, a buried gate 130 is formed over the gate insulation film 124 in such a manner that the bottom part of the recess 122 is buried with the buried gate 130.

For example, a gate conductive film is deposited over the gate insulation film 124 in such a manner that the recess 122 is buried with the gate conductive film. In certain embodiments, the gate conductive film may include a titanium nitride film (TiN), a tantalum nitride film (TaN), and/or a tungsten film (W), etc. For example, after the TiN film (or TaN film) having a high work function is conformably deposited to a thin thickness on the gate insulation film 124, the tungsten (W) film for reducing resistance may be gap-filled to form a gate conductive film. Alternatively, the TiN film or the TaN film may be deposited, or the TiN film, the TaN film, and the tungsten (W) film are sequentially deposited, such that a conductive film can be formed.

Subsequently, the CMP process and the etchback process are sequentially performed on the gate conductive film. The top surface of the gate conductive film is located beneath the top surface of the active region 120, such that the buried gate 130 can be formed.

Subsequently, a sealing layer 132 is formed over the buried gate 130. In this embodiment, the sealing layer 132 may be formed of a nitride film.

Figure 3C:
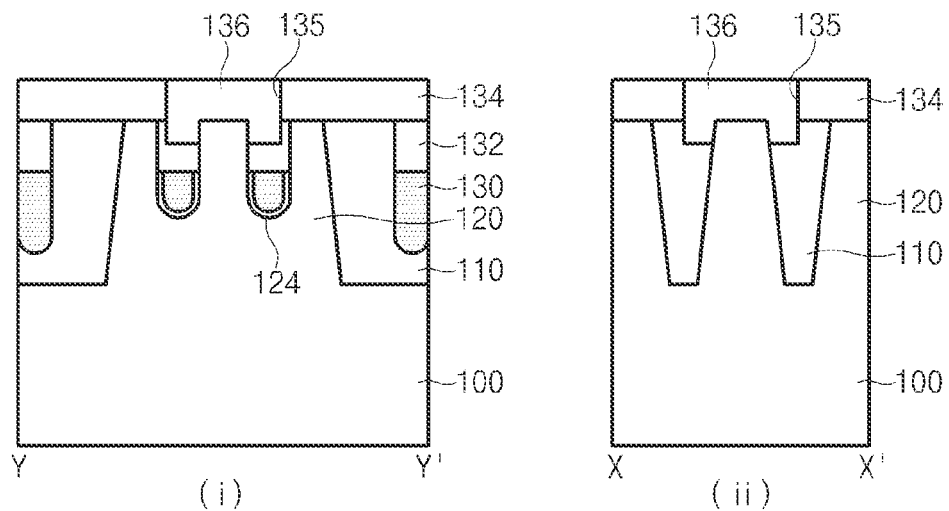

Referring to FIG. 3C, an interlayer insulation film 134 is formed over the device isolation film 110, the active region 120, and the sealing layer 132. In this embodiment, a Tetraethyl orthosilicate (TEOS) film of the interlayer insulation film 134 may be formed to have a thickness of several hundreds of Å.

Figure 4:
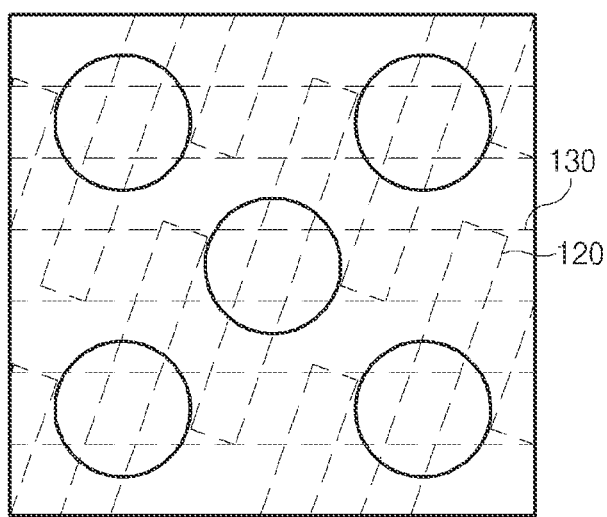
FIG. 4 shows a bit line contact mask.

After the bit line contact mask shown in FIG. 4 is formed over the interlayer insulation film 134, the interlayer insulation film 134, the device isolation film 110, and the sealing layer 132 are sequentially etched using the bit line contact mask as an etch mask. In this manner, the bit line contact hole 135 is formed.

Each region for forming the bit line contact hole may correspond to a circular region of FIG. 4. In this case, a diameter of the circular cross-section (i.e., a horizontal cross-section) of the bit line contact hole 135 may be longer than a short-axis length of the active region 120.

In addition, a diameter of the circular cross-section (i.e., a horizontal cross-section) of the bit line contact hole 135 may be longer than the length of the active region formed between the buried gates 130. Therefore, the top part of the active region between the buried gates 130 is protruded to a predetermined height at the lower part of the bit line contact hole 135. That is, the top and lateral surfaces of the active region located between the buried gates 130 may be exposed.

Subsequently, after a conductive film (not shown) is formed to bury the bit line contact hole 135, the conductive film is planarized to expose the interlayer insulation film 134, such that a contact layer 136 is formed. Therefore, the contact layer 136 may be formed to enclose the protruded active region 120. That is, the contact layer 136 is formed to contact not only the top surface of the active region 120 between the buried gates 130 but also the lateral surface of the active region 120, such that the contact region between the bit line contact 136 and the active region 120 can be increased. In this case, the conductive film may be formed of a poly, and/or may be formed of a laminated structure of a barrier metal and a metal film (e.g. W).

Figure 3D:
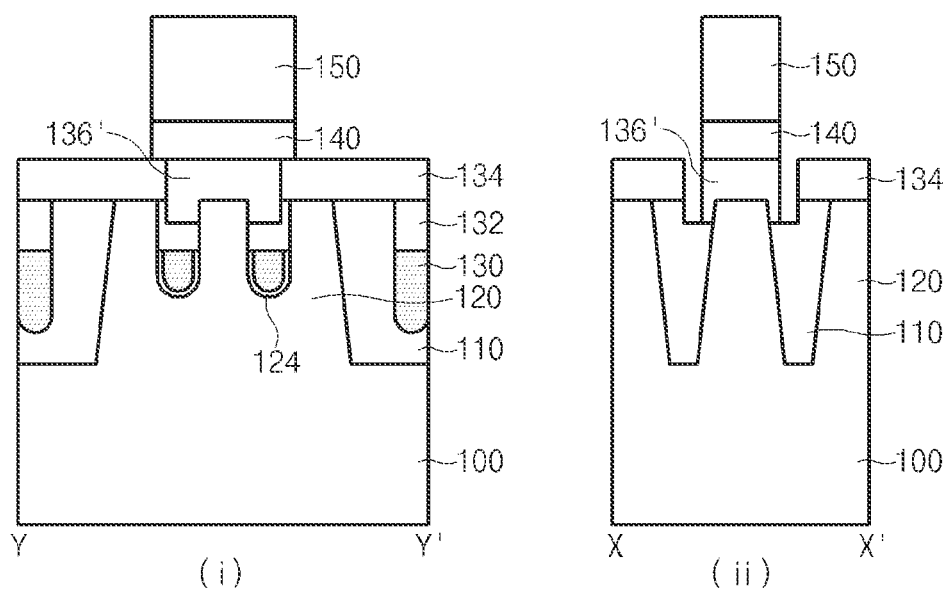

Referring to FIG. 3D, a bitline conductive film (not shown) and a hard mask layer (not shown) are formed over the interlayer insulation film 134 including the contact layer 136. In this case, the bitline conductive film may be formed of a laminated structure of a barrier metal and a metal layer (W).

Subsequently, the hard mask layer, the bitline conductive film, and the contact layer 136 are etched using a bit line mask defining a bit line region, such that the hard mask pattern 150, the bit line 140, and the bit line contact 136' are formed. In other words, the contact layer 136 is etched by the bit line mask, such that a specific region not overlapping with the bit line 140 is removed from the contact layer 136. Therefore, the Y-Y' directional length of the bit line contact 136' may be that of the contact layer 136, but the X-X' directional length thereof may be the width of the bit line 140.

The bit line contact 136' is formed to enclose the upper part of the active region 120. The contact area between the bit line contact 136' and the active region 120 is increased and does not escape from the area of the bit line 140, such that an adequate margin between the bit line contact 136' and a storage node contact (not shown) of a neighbor active region can be assured.

In this case, as shown in FIG. 2(iii), assuming that the bit line 140 is formed to have a smaller width, a bit line contact 136" may be formed in such a manner that it contacts the lateral surface of the active region in the direction of Y-Y' and does not contact the lateral surface of the active region in the direction of X-X'.

Thereafter, after an interlayer insulation film (not shown) is formed to cover the bit line contact 136', the bit line 140, and the hard mask pattern 150, a data storage unit (not shown) such as a storage node contact (not shown) and a capacitor is formed. The above-mentioned subsequent process may be achieved as in the related art, and as such a detailed description thereof will herein be omitted for convenience of description.

In certain embodiments, the data storage unit may be diversified according to categories of the semiconductor devices. For example, if the above-mentioned bit line contact structure is applied to a Dynamic Random Access Memory (DRAM), the data storage unit may be a capacitor. If the above-mentioned bit line contact structure is applied to a ferroelectric RAM (FeRAM), a ferroelectric material may be used as a capacitor material. If the above-mentioned bit line contact structure is applied to a Magnetic RAM (MRAM), the data storage unit may be a Magnetic Tunnel Junction (MTJ). If the above-mentioned bit line contact structure is applied to a Phase Change RAM (PRAM) or a Resistance RAM (ReRAM), a phase change material may be used as the data storage unit.

Figure 5:
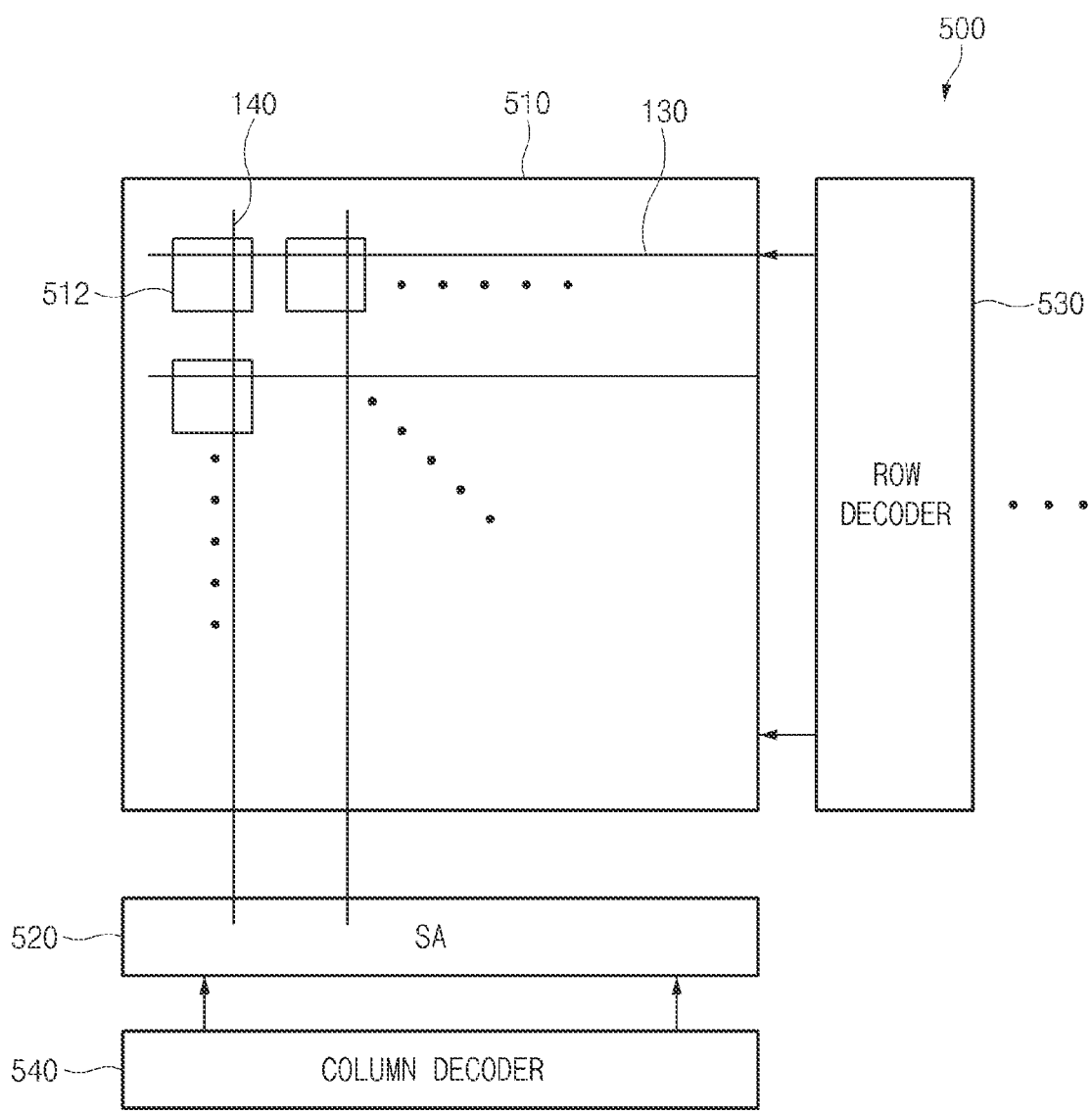
FIG. 5 is a block diagram illustrating an embodiment of a semiconductor device including the cell array structure shown in FIG. 1.

FIG. 5 is a block diagram illustrating a semiconductor device including the cell array structure shown in FIG. 1.

Referring to FIG. 5, the semiconductor device 500 may include a memory cell array 510, a sense amplifier (SA) 520, a row decoder 530, and column decoder 540.

The cell array 510 includes several memory cells 512, that are coupled to a word line (buried gate) 130 and the bit line 140 and are arranged in the form of a matrix. In this case, each memory cell 512 and a bit line contact for interconnecting the memory cell 512 and the bit line 140 may have the same structures as those of FIGS. 1 and 2.

The sense amplifier 520 is coupled to the bit line 140 so that it can sense and amplify data stored in the memory cell 512 of the cell array 510.

The row decoder 530 generates a word line selection signal for selecting the memory cell 512 in which data is to be read or written, and outputs the word line selection signal to the word line 130.

The column decoder 540 generates a drive signal for operating the sense amplifier 520 coupled to the cell 512 selected by the row decoder 530, and outputs the drive signal to the sense amplifier 520.

The sense amplifier 520 and the decoders 530 and 540 have been designed to be used for general semiconductor devices, and as such a detailed description thereof is omitted for convenience of description.

The semiconductor device can be applied to computing memories (for example, DRAM, SRAM, DDR3 SDRAM, DDR2 SDRAM, DDR SDRAM, etc.), consumer memories (for example, DDR3 SDRAM, DDR2 SDRAM, DDR SDRAM, SDR SDRAM, etc.), graphics memories (for example, DDR3 SDRAM, GDDR3 SDMRA, GDDR4 SDRAM, GDDR5 SDRAM, etc.), mobile memories (for example, Mobile SDR, Mobile DDR, Mobile DDR2, MCP (Multi Chip Package), PoP (Package on Package), PSRAM, LPDDR), NAND flash memories, a Magnetic RAM (MRAM), a Ferroelectric RAM (FeRAM), a Phase Change RAM (PRAM), a Resistance RAM (ReRAM), a Synchronous Graphics RAM (SGRAM), and the like.

Figure 6:
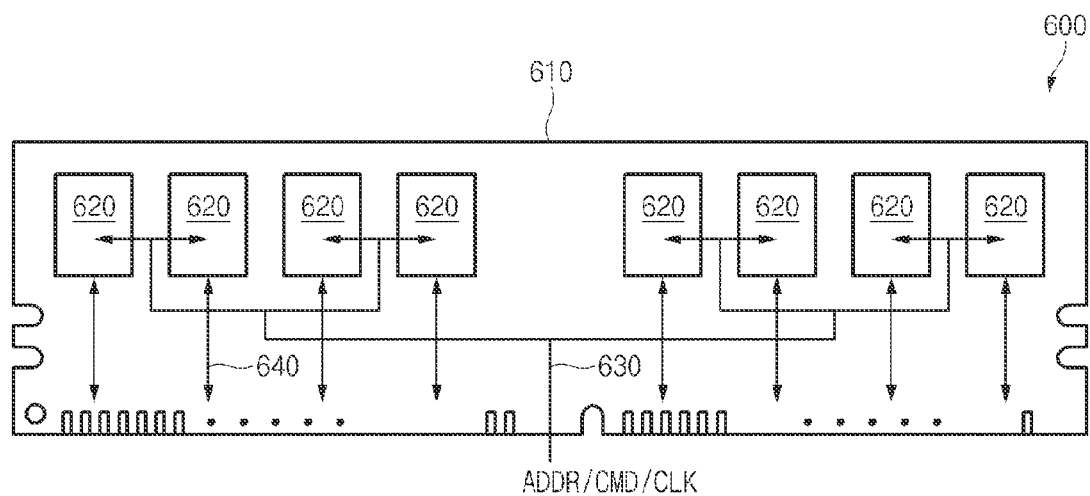
FIG. 6 shows a semiconductor module according to one embodiment of the present invention.

FIG. 6 shows a semiconductor module according to one embodiment of the present invention.

Referring to FIG. 6, the semiconductor module 600 includes a plurality of semiconductor elements 620 mounted to a module substrate 610 A command link 630 allows each semiconductor element 620 to receive control signals (for example, an address signal (ADDR), a command signal (CMD), and a clock signal (CLK)) from an external controller (not shown) Data link 640 is coupled to the semiconductor element 620 so as to transmit input/output (I/O) data.

In this embodiment, the semiconductor elements 620 may be exemplarily implemented as the semiconductor devices 500 shown in FIG. 5. According to each semiconductor element 620 mounted to the module substrate 610, the bit line contact is formed to enclose the top and lateral surfaces of the active region as shown in FIGS. 1 and 2. The command link 630 and the data link 640 may be formed to be identical or similar to those of general semiconductor modules.

Although eight semiconductor chips are mounted to the front surface of the module substrate 610 as shown in FIG. 6, it should be noted that the semiconductor devices can be mounted to the back surface of the module substrate 610. That is, the semiconductor elements 620 may be mounted to one side or both sides of the module substrate 610, and the number of mounted semiconductor elements 620 is not limited to the example of FIG. 6.

Figure 7:
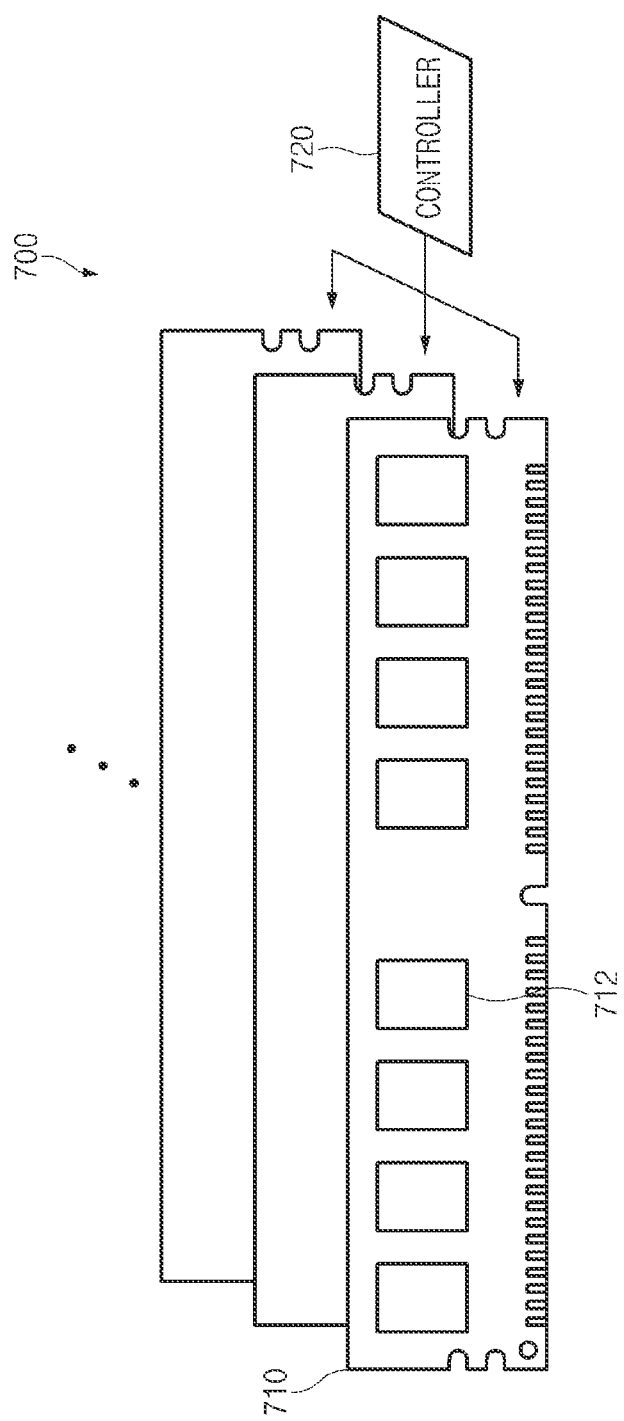
FIG. 7 shows a semiconductor system according to one embodiment of the present invention.

FIG. 7 shows a semiconductor system according to one embodiment of the present invention.

Referring to FIG. 7, a semiconductor system 700 includes at least one semiconductor module 710 including a plurality of semiconductor elements 712, and a controller 720 for providing a bidirectional interface between each semiconductor module 710 and an external system (not shown) so as to control the operations of the semiconductor module 710.

The controller 720 may be identical or similar in function to a controller for controlling a plurality of semiconductor modules for use in a general data processing system, and as such a detailed description thereof will be omitted herein for convenience of description.

In this case, the semiconductor module 710 may be, for example, a semiconductor module shown in FIG. 6.

Figure 8:
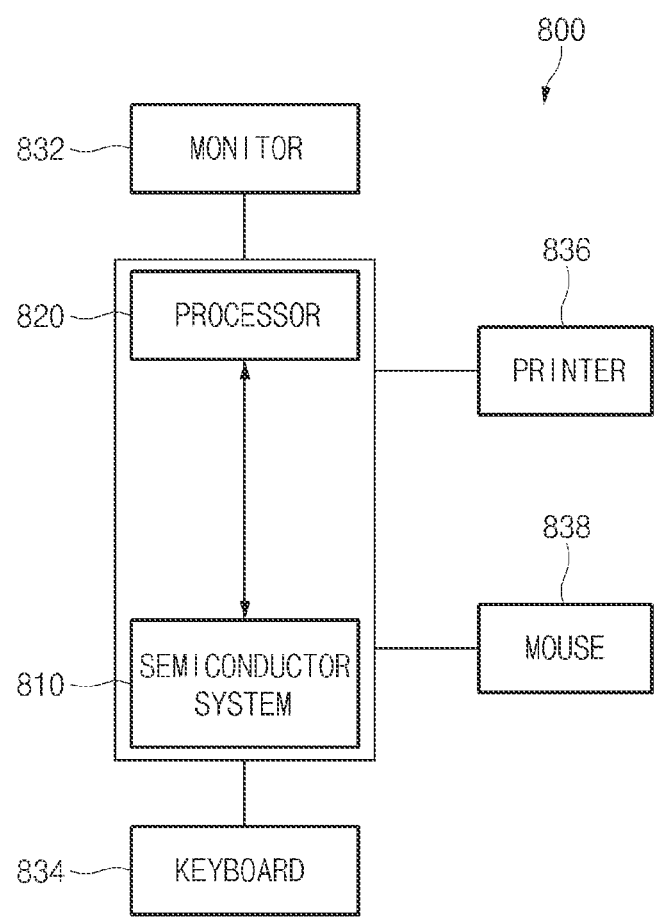
FIG. 8 shows a computer system according to one embodiment of the present invention.

FIG. 8 shows a computer system according to one embodiment of the present invention.

Referring to FIG. 8, the computer system 800 includes a semiconductor system 810 and a processor 820 such as a Central Processing Unit (CPU).

The semiconductor system 810 may store data requisite for controlling the operations of the computer system 800. In this case, the semiconductor system 810 may exemplarily be used as the semiconductor system 700 shown in FIG. 7.

The processor 820 controls the operations of the computer system 800 by processing data stored in the semiconductor system 810. The processor 820 may be identical or similar in function to the CPU used in a general computer system.

The computer system 800 may include a variety of user interface devices, for example, a monitor 832, a keyboard 834, a printer 836, a mouse 838, etc.

Figure 9:
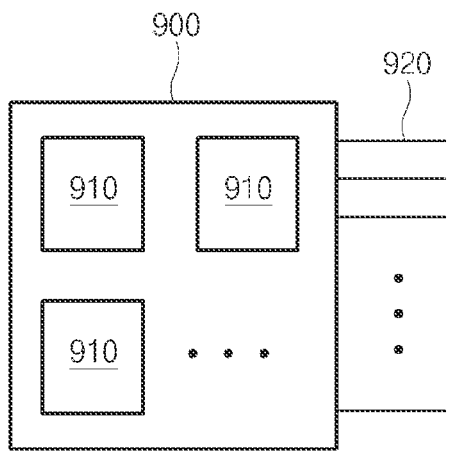
FIG. 9 shows a data processing system according to one embodiment of the present invention.

FIG. 9 shows a data processing system according to one embodiment of the present invention.

Referring to FIG. 9, the data processing system 900 is included in an electronic system (not shown), such that it performs a specific function from among several functions of the electronic system.

The data processing system 900 may include at least one semiconductor device 910 mounted to the substrate.

The semiconductor device 910 includes a cell array (not shown) for storing data needed for performing a specific function of the electronic system, and a processor (not shown) for performing the corresponding function by processing the data stored in the cell array. That is, the semiconductor element device 910 includes a unit for storing data in one unit element (die or chip) and a unit for performing a specific function of the electronic system by processing the stored data.

In this case, the cell array may include the cell array 510 shown in FIG. 5.

The data processing system 900 is coupled to other constituent elements (for example, CPUs) of the electronic system through leads 910, such that it can unidirectionally or bidirectionally transmit and receive data and control signals in one or two.

Figure 10:
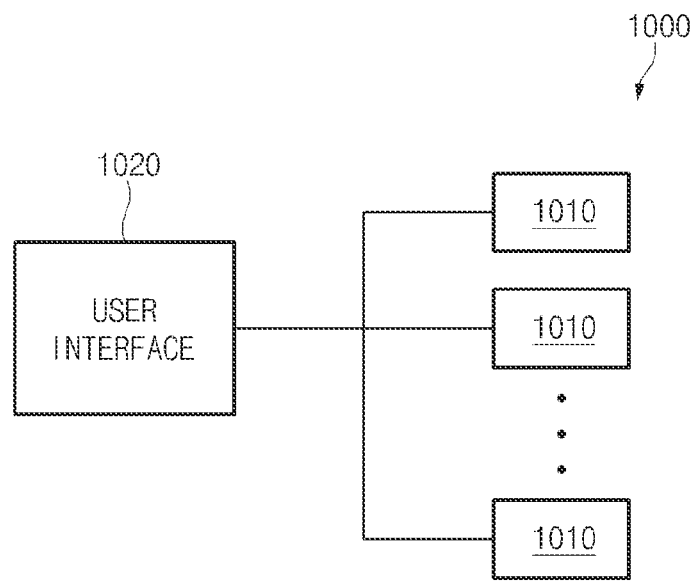
FIG. 10 shows an electronic system according to one embodiment of the present invention.

FIG. 10 shows an electronic system according to one embodiment of the present invention.

Referring to FIG. 10, the electronic system 1000 includes at least one data processing system 1010 and a user interface 1020.

The data processing system 1010 performs a specific function from among several functions of the electronic system 1000, and includes at least one semiconductor device mounted to the substrate. The semiconductor device may include a cell array (not shown) for storing data needed for performing a specific function of the electronic system 1000 and a processor (not shown) for controlling the corresponding function by processing the data stored in the cell array. In this case, the cell array may be the cell array 510 shown in FIG. 5.

The user interface 1020 provides an interface between the user and the circuit module 1010. The user interface 1020 may include a keypad, a touch-screen, a speaker, etc. incorporated into the electronic device.

The electronic system 1000 includes a variety of embedded systems included in various electronic, information, and communication devices, for example, computers, household appliances, factory automation systems, elevators, mobile phones, etc.

As is apparent from the above description, embodiments of the present invention increase a bit line contact area by improving a bit line contact structure, resulting in the prevention of a high-resistive failure of the bit line contact.

The present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
 a first gate buried in a lower part of a first trench defined in an active region;
 a first sealing layer provided at an upper part of the first trench and over the first gate;
 a second gate buried in a lower part of a second trench defined in the active region;
 a second sealing layer provided at an upper part of the second trench and over the second gate; and
 a contact plug associated with the first gate and the second gate, the contact plug extending between the first and second trenches to contact a top surface, the contact plug extending partly into the first and second trenches,
 wherein the contact plug contacts a lateral surface of the active region between the first and second trenches, the lateral surface including an inner lateral surface of the first trench.

2. The semiconductor device according to claim 1, wherein the contact plug is formed to enclose an upper part of the active region between the first trench and the second trench.

3. The semiconductor device according to claim 1, wherein the lateral surface corresponds to an area which overlaps a bit line from among the inner lateral surfaces of the first and second trenches.

4. A semiconductor device comprising:
 an active region provided on a substrate;
 a first trench defined in the active region;
 a first gate buried in a lower part of the first trench;
 a first sealing layer provided at an upper part of the first trench; and
 a contact plug extending into the first trench, the contact plug contacting a top surface and a first lateral surface of the active region,
 wherein the first lateral surface of the active region includes an inner lateral surface of the first trench.

5. The semiconductor device according to claim 4, wherein the first lateral surface is a sidewall of the first trench.

6. The semiconductor device according to claim 4, further comprising:
 a second trench defined in the active region;
 a second gate buried in a lower part of the second trench; and
 a second sealing layer provided at an upper part of the second trench,
 wherein the contact plug extends into the second trench and contacts a second lateral surface of the active region.

7. A method for forming a semiconductor device comprising:
 forming a device isolation film defining an active region;
 forming a first buried gate and a second buried gate over the active region;
 forming a contact hole to protrude to the active region located between the first buried gate and the second buried gate;
 forming a contact layer to bury the contact hole;

forming a conductive film over the contact layer; and forming a bit line and a bit line contact by etching the conductive film and the contact layer, wherein the forming the bit line and the bit line contact includes sequentially etching the conductive film and the contact layer using a bit line mask.

8. The method according to claim 7, wherein forming the first buried gate and the second buried gate includes:

forming a first trench and a second trench by etching the active region;

forming a gate conductive film at lower parts of the first and second trenches; and forming a sealing layer over the gate conductive film so as to bury the first trench and the second trench.

9. The method according to claim 8, wherein the forming the contact hole includes:

forming an interlayer insulation film over the active region including the gate conductive film and the sealing layer; and etching the interlayer insulation film, the device isolation film, and the sealing layer using a bit line contact mask, thereby exposing a top surface and lateral surfaces of the active region between the first buried gate and the second buried gate.

10. The method according to claim 7, wherein forming the bit line contact includes etching the contact layer in a manner that the contact layer contacts a top surface of the active region and inner lateral surfaces of the first and second trenches.

* * * * *